United States Patent
Messier et al.

(10) Patent No.: US 11,415,623 B2
(45) Date of Patent: Aug. 16, 2022

(54) TEST SYSTEM SUPPORTING REVERSE COMPLIANCE

(71) Applicant: Teradyne, Inc., North Reading, MA (US)

(72) Inventors: Jason A. Messier, Winchester, MA (US); Bryce M. Wynn, Cambridge, MA (US); Ernest DiMicco, Woburn, MA (US)

(73) Assignee: Teradyne, Inc., North Reading, MA (US)

( * ) Notice: Subject to any disclaimer, the term of this patent is extended or adjusted under 35 U.S.C. 154(b) by 665 days.

(21) Appl. No.: 16/367,675

(22) Filed: Mar. 28, 2019

(65) Prior Publication Data

US 2020/0309849 A1    Oct. 1, 2020

(51) Int. Cl.
     *G01R 31/28*      (2006.01)
     *G01R 31/319*     (2006.01)
     *G06F 17/11*      (2006.01)

(52) U.S. Cl.
     CPC ... *G01R 31/2879* (2013.01); *G01R 31/31908* (2013.01); *G01R 31/31905* (2013.01); *G06F 17/11* (2013.01)

(58) Field of Classification Search
     CPC .... G01R 1/36; G01R 31/2879; G01R 31/002; G01R 31/31905; G01R 31/31908; G01R 31/31903; G01R 31/31924; G01R 15/146; G06F 17/11
See application file for complete search history.

(56) References Cited

U.S. PATENT DOCUMENTS

| | | | |
|---|---|---|---|
| 7,327,816 B2 | 2/2008 | Messier | |
| 7,336,748 B2 | 2/2008 | Messier | |
| 7,523,238 B2 | 4/2009 | Messier | |
| 8,144,040 B2 | 3/2012 | Messier et al. | |
| 8,193,956 B2 | 6/2012 | Messier | |
| 9,135,132 B2 | 9/2015 | Han | |
| 2004/0017219 A1 | 1/2004 | Han | |
| 2005/0088197 A1 | 4/2005 | Aghaeepour | |
| 2005/0135524 A1 | 6/2005 | Messier | |
| 2005/0135525 A1 | 6/2005 | Messier | |
| 2006/0132166 A1 | 6/2006 | Walker et al. | |
| 2007/0005282 A1 | 1/2007 | Messier | |

(Continued)

FOREIGN PATENT DOCUMENTS

KR    10-2013-0031022 A    3/2013

OTHER PUBLICATIONS

International Preliminary Report on Patentability dated Sep. 28, 2021, International Application No. PCT/US2020/018784 filed Feb. 19, 2020 (7 pages).

(Continued)

*Primary Examiner* — Alvaro E Fortich
*Assistant Examiner* — Zannatul Ferdous
(74) *Attorney, Agent, or Firm* — Burns & Levinson LLP

(57) ABSTRACT

An example test system includes power amplifier circuitry to force voltage or current to a test channel and one or more processing devices configured to control the power amplifier circuitry to comply with a compliance curve. The compliance curve relates output of the voltage to output of the current. According to the compliance curve, maximum current output increases as an absolute value of the voltage output increases.

37 Claims, 9 Drawing Sheets

(56) References Cited

U.S. PATENT DOCUMENTS

| | | |
|---|---|---|
| 2009/0168575 A1 | 7/2009 | Messier |
| 2011/0001644 A1 | 1/2011 | Messier |
| 2011/0001645 A1 | 1/2011 | Messier et al. |
| 2013/0073907 A1 | 3/2013 | Han |
| 2013/0181736 A1 | 7/2013 | Gostein et al. |
| 2013/0229197 A1* | 9/2013 | Kusaka .............. G01R 31/2832 324/750.01 |
| 2018/0323608 A1* | 11/2018 | Valdivia Guerrero .... G05F 1/66 |

OTHER PUBLICATIONS

Written Opinion for PCT/US2020/018784, 6 pages (dated Jun. 16, 2020).

International Search Report for PCT/US2020/018784, 3 pages (dated Jun. 16, 2020).

Grace, J.W. et al., Integrated Pin Electronics for Automatic Test Equipment, Hewlett-Packard Journal, 42-50 (Oct. 1994).

Keysight Technologies, Current-voltage (IV) curve measurement fundamentals by using source/measure unit (SMU), Keysight (formerly Agilent's Electronic Measurement), 3 pages (2000-2019). URL: https://www.keysight.com/main/editorial.jspx?ckey=2317324&nid=2317324&nid=-33044.0&lc=eng&cc=US [Retrieved Apr. 1, 2019].

* cited by examiner

TEST SYSTEM SUPPORTING REVERSE COMPLIANCE

TECHNICAL FIELD

This specification describes example implementations of a test system that supports a compliance curve in which current on a test channel increases as voltage on the test channel increases.

BACKGROUND

Test systems are configured to test the operation of electronic devices, such as microprocessors and memory chips. Testing may include sending signals to a device and determining how the device reacted to those signals based on its response. For example, testing may include forcing voltage and current onto a test channel and receiving signals from the device based on the forced voltage and current. The device's reaction will dictate whether the device has passed or failed testing.

SUMMARY

An example test system includes power amplifier circuitry to force voltage or current to a test channel and one or more processing devices configured to control the power amplifier circuitry to comply with a compliance curve. The compliance curve relates output of the voltage to output of the current. According to the compliance curve maximum current output increases as an absolute value of voltage output increases. The example test system may include one or more of the following features, either alone or in combination.

The voltage may be direct current (DC) voltage and the current may be DC current. The example test system may include a compensation loop. The compensation loop may include a voltage sensor to sense the voltage on the test channel, a current sensor to sense the current on the test channel, and the one or more processing devices to control the power amplifier circuitry based on the voltage sensed on the test channel and the current sensed on the test channel. The example test system may include a current clamp to limit the current on the test channel in a case that the current sensed on the test channel exceeds a predefined maximum value.

The compliance curve may be based on an amount of power that the test channel can dissipate. The compliance curve is a first compliance curve and a memory stores a second compliance curve or information to produce the second compliance curve relating output of the voltage to output of the current. According to the second compliance curve maximum current output decreases as absolute value of the voltage output increases. The one or more processing devices are configured to control the power amplifier circuitry based on one of the first compliance curve or the second compliance curve. At least one of the first compliance curve or the second compliance curve includes a step function. The first compliance curve may include a step function and the second compliance curve includes a step function.

The one or more processing devices may be configured to implement a controller comprising a proportional-integral-derivative controller to control the power amplifier circuitry. The example test system may include a display device to display a function based on the compliance curve to a user and an input device to program the voltage based on the function. The function may be the compliance curve. The function may be a step function that falls with bounds of the compliance curve.

Controlling the power amplifier circuitry to comply with the compliance curve may include setting the current. Setting the current may be based on an amount of power that the test channel can dissipate, a maximum voltage, and the voltage that has been programmed into the test system. Setting the current may be conditioned on the voltage that has been programmed into the test system being less than or equal to a difference between the maximum voltage and an overhead voltage.

The power amplifier circuitry may include an output stage for the test channel that is connected to a reference voltage and a return conductor. The reference voltage may be higher than a voltage of the return conductor. The voltage of the return conductor may be non-zero. The compliance curve may be a first compliance curve and controlling the power amplifier circuitry to comply with the first compliance curve may include setting the current based on the voltage that has been programmed into the test system. The first compliance curve may enable a test channel density that is greater than a test channel density that would be enabled by a second compliance curve according to which maximum current output decreases as voltage output increases. The power amplifier circuitry may include an output stage. The output stage may have a physical size that corresponds to a power dissipation of the output stage. Using the second compliance curve may cause a power output to a device under test (DUT) that is greater than a power output caused using the first compliance curve such that a reduction in a physical size of the output stage is enabled by using the first compliance curve.

The power amplifier circuitry may include an output stage for the test channel that is connected to a first reference voltage and a second reference voltage. The first reference voltage may be higher than the second reference voltage. The example test system may include a voltage sensor for sensing the voltage on the test channel. The one or more processing devices may be configured to control at least one of the first reference voltage or the second reference voltage based on the voltage on the test channel in order to control power output to the test channel. At least one of the first reference voltage or the second reference voltage is programmable.

The example test system may include memory storing the compliance curve or a function to produce the second compliance curve. The first compliance curve may include a curve in which current increases with increasing voltage up to a point. After the point, the current may remain constant for a range of increasing voltage. The voltage may be alternating current (AC) voltage and the current may be AC current.

An example method includes receiving voltage as an input to a test system; selecting a compliance curve based on the voltage, where according to the compliance curve maximum current output increases as an absolute value of voltage output increases; generating a current output based on the voltage input and the compliance curve; and outputting the voltage and the current to a test channel of the test system.

An example test system includes an output stage having power amplifier circuitry to force voltage or current to a test channel that is part of a connection to a DUT; a current clamp to limit the current on the test channel; and one or more processing devices configured control the current clamp dynamically based on a voltage across the DUT. The example test system may include one or more of the following features, either alone or in combination.

A power dissipation through the output stage is based on a product of a current through the DUT and a difference between a voltage across the output stage and a voltage across the DUT. Controlling the current dynamically may include controlling the limit of the current on the test channel. Controlling the current clamp may include programming the current clamp. The one or more processing devices may be configured to control the power amplifier circuitry to comply with a compliance curve. The compliance curve may relate output of the voltage to output of the current. According to the compliance curve maximum current output increases as an absolute value of the voltage output increases.

Any two or more of the features described in this specification, including in this summary section, may be combined to form implementations not specifically described in this specification.

At least part of the test systems and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the test systems and processes described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

In some examples, a compliance curve specifies the power dissipation of a test channel at a device under test (DUT). In some cases, the test channel includes the physical medium or media over which signals are sent from a test system to the DUT and over which signals are received from the DUT. In these cases, the test channel is part of an electrical and/or optical connection between the test system and the DUT.

Figure 1:
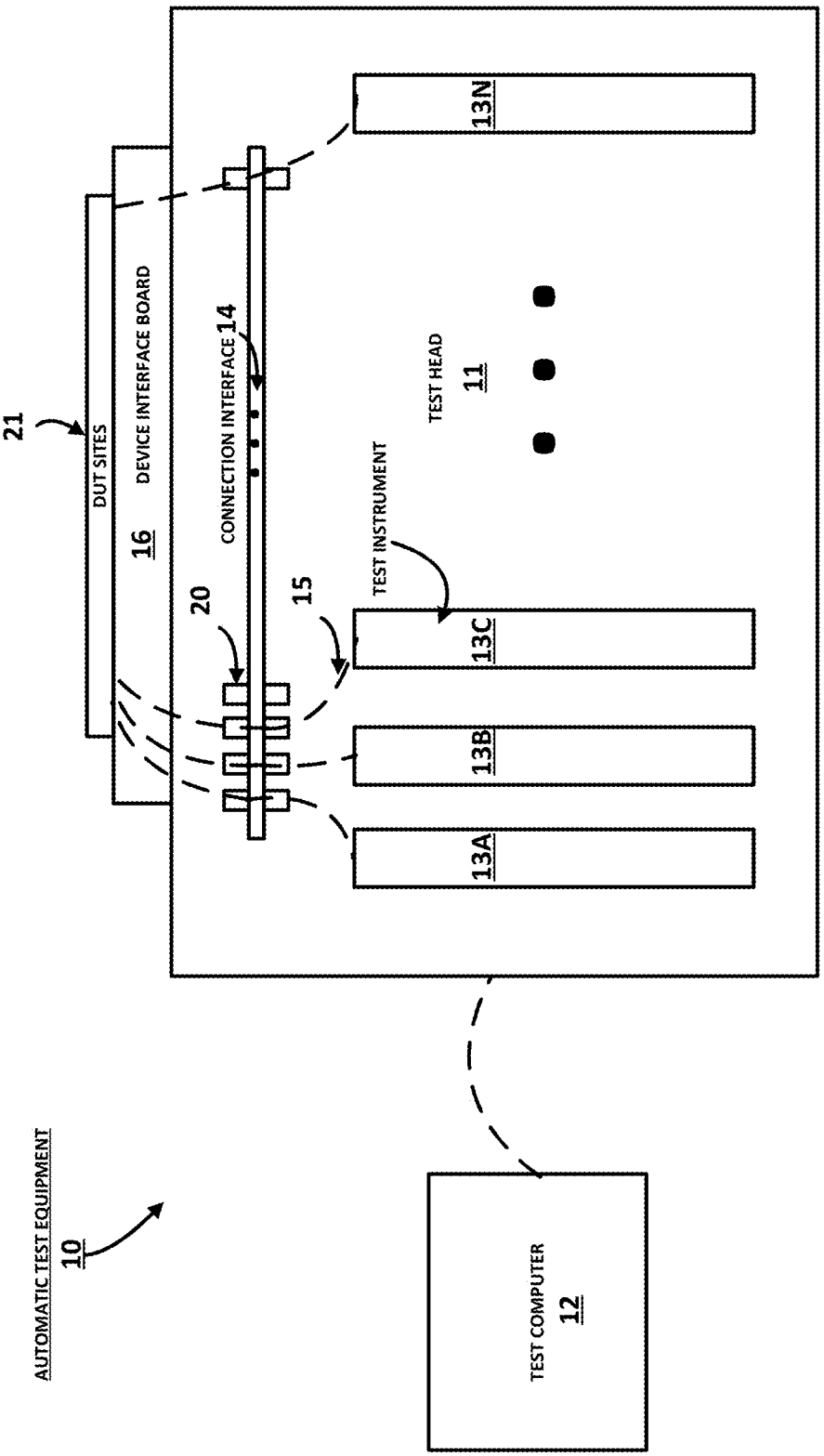
FIG. 1 is a block diagram of an example test system.

Each example test channel has an output stage that dissipates a fixed amount of power for an input voltage. In some implementations, the input voltage may be programmable, in which case the amount of power dissipation for the output stage will change based on a change in the voltage. Each test channel may be governed by a compliance curve that specifies the current that can pass through the test channel for a given voltage. For example, a user may specify a voltage to be provided on the test channel. For that voltage, the compliance curve specifies one or more values of—for example, a range of—current that the test channel can support. In some traditional compliance curves, as the voltage increases, the current decreases. In a reverse compliance curve, as the absolute value of the voltage increases, the current also increases. Described herein are example implementations of a test system that supports both reverse compliance curves and traditional compliance curves. Example components of a test system are shown in FIG. 1, which is described below.

In some implementations, each test channel of the test system includes an output stage that includes power amplifier circuitry—also referred to herein as "power amplifier"—to force voltage and current to the test channel. One or more processing device are configured to control the power amplifier circuitry based on a compliance curve to provide power to the DUT. As explained, the compliance curve relates output of voltage to output of current on the test channel—for example, the voltage and current delivered to the DUT. In an example, the compliance curve is a reverse compliance curve in which the maximum current output increases as the absolute value of the voltage output increases. The test system, however, may also support a traditional compliance curve in which the maximum current output decreases as the voltage output increases. Multiple test channels—for example, each test channel—may include an instance of the power amplifier circuitry, one or more processing devices dedicated to that test channel, or both an instance of the power amplifier circuitry and one or more dedicated processing devices.

A compliance curve can define the power dissipation in a test channel in one or more quadrants of an operational graph. For example, a compliance curve may define the power dissipation of the test channel in up to four quadrants of a graph; that is, for positive voltage and positive current, for positive voltage and negative current, for negative voltage and positive current, or for negative voltage and negative current. Accordingly, although the examples presented herein are generally limited to one or two quadrants, the features described in this specification may be used with compliance curves that define the power dissipation of the test channel in any number of quadrants.

Figure 2:
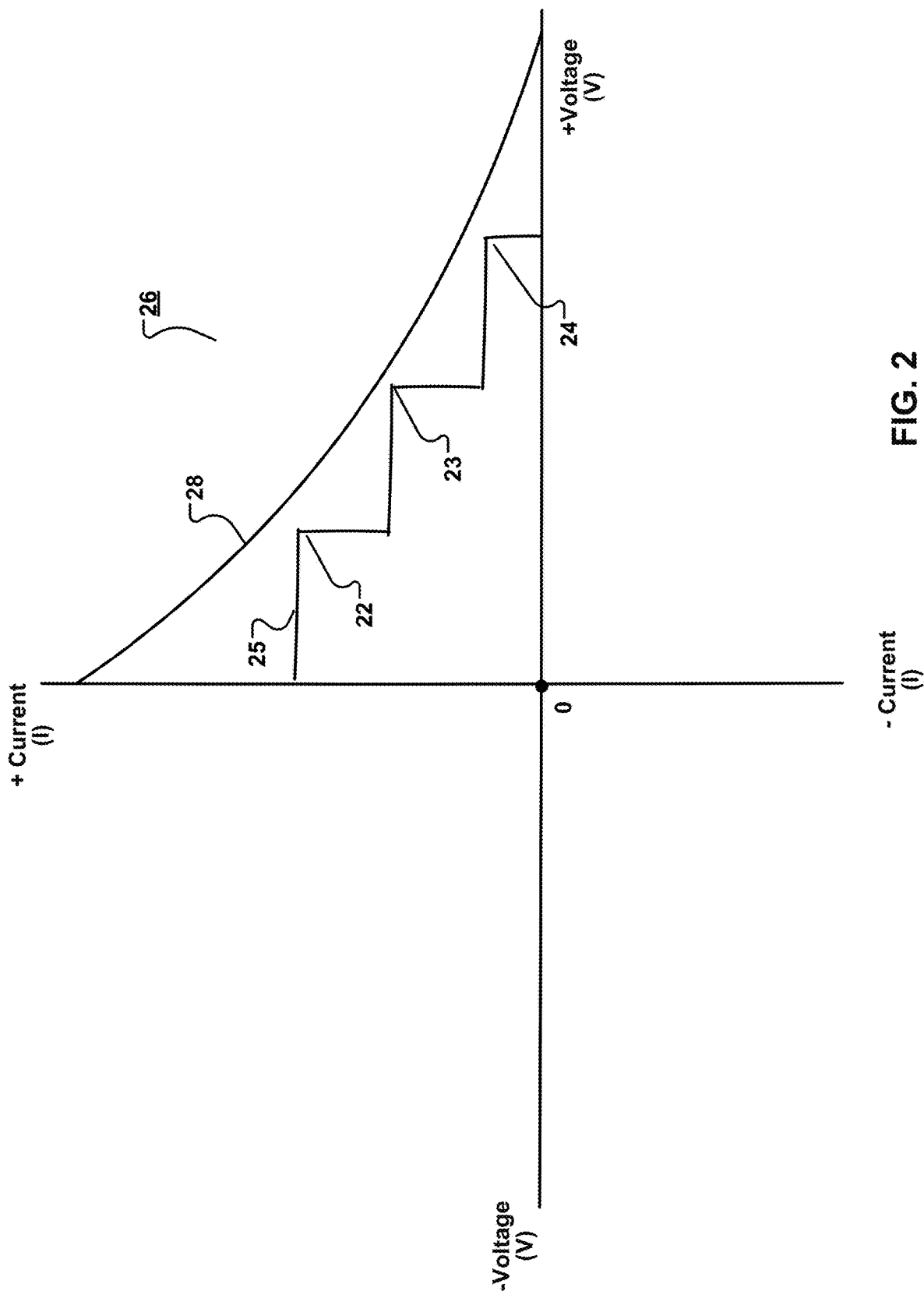
FIG. 2 is a graph showing an example traditional compliance curve in both a presented version and an actual version.

FIG. 2 shows an example of a traditional compliance curve 25 that defines the power dissipation of the test channel—for example, the power dissipation at the DUT—in first quadrant 26, that is, positive voltage (+V), positive current (+I). As shown in FIG. 2, in this example, in first quadrant 26, as the magnitude of the voltage increases, the magnitude of the current decreases. Each test channel output stage dissipates an amount of power. Power to the DUT can be output by applying any appropriate ranges of current and voltage to the test channel that are within the power dissipation of the output stage. In some examples, power dissipated in the test channel beyond that defined by the compliance curve—for example, as a result of a short of a voltage rail to ground—may cause the test channel not to operate correctly, to be physically damaged, or both.

In some cases, the compliance curve includes only the operational range of a test channel presented to a user, not the entire operational range of the test channel. The user may select a voltage and current from the presented compliance curve to ensure safe and accurate operational range of the test channel. However, the actual compliance curve of the test channel extends beyond the compliance curve presented to the user. For example, in FIG. 2, presented compliance curve 25 is a step function that is within the bounds of the actual compliance curve 28. The actual compliance curve 28 is non-linear and encompasses all of, and extends beyond, presented compliance curve 25 as shown in the figure. The presented compliance curve does not track the boundaries of actual compliance curve 28 and, therefore, reduces the risk of test channel power dissipation at a power level beyond that which the test channel can support. In this specification, the term "compliance curve" may refer to either an actual compliance curve such as 28 or a presented compliance curve such as 25.

Figure 8:
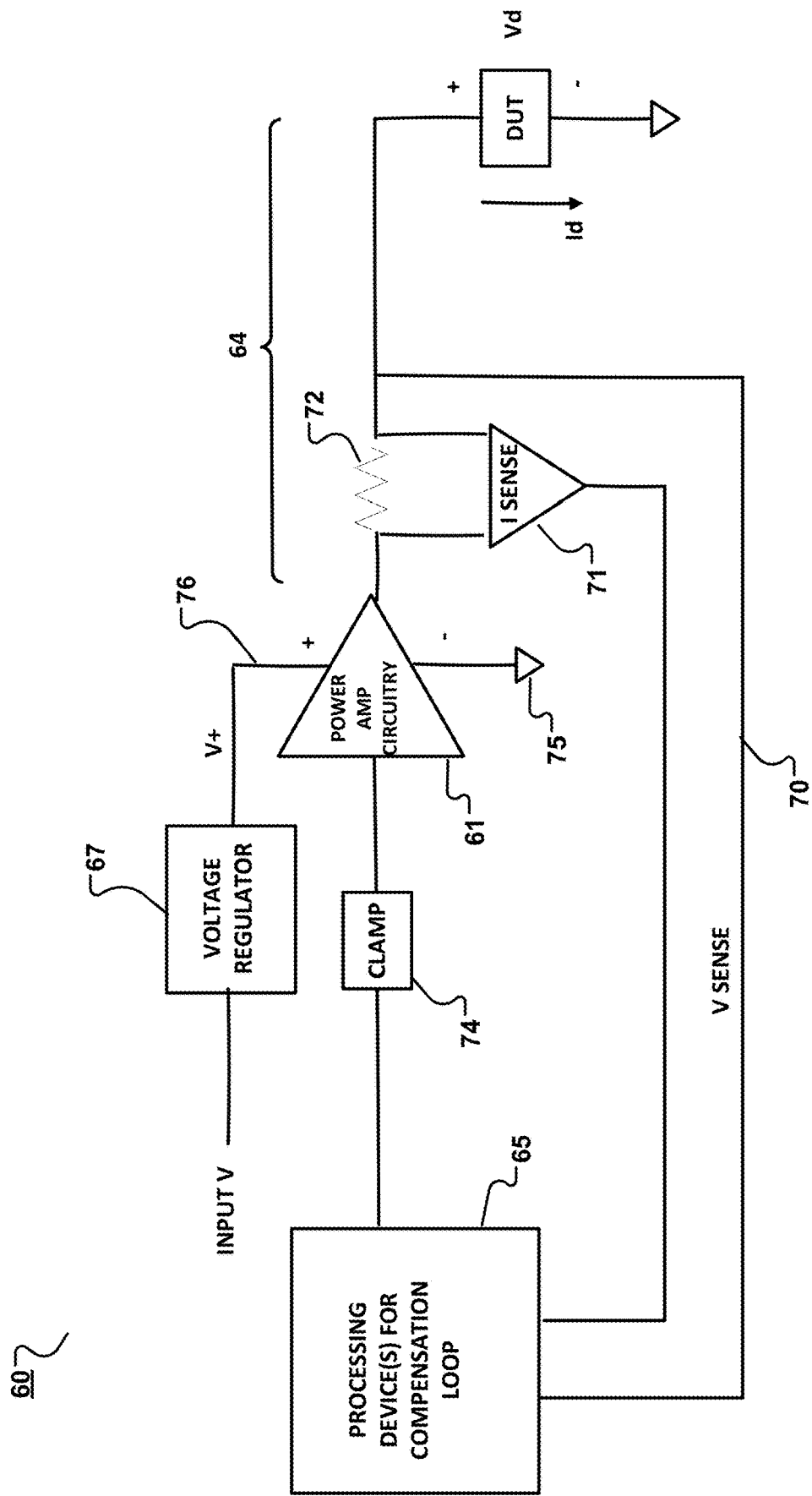
FIG. 8 is a block diagram showing example components of an example output stage of a test channel.

In contrast to power dissipation of the output stage, the instantaneous power delivered to the DUT is defined by the product of a voltage and a current at points within the compliance curve. In FIG. 2, this power is defined by a product of selected voltages and currents within the compliance curve. In example compliance curve 25, this power to the DUT is typically approximately the same at points 22, 23, and 24. That is, as the voltage increases, the current decreases, but the product of the two remains the same. For example, FIG. 8 shows components of an example output stage. In FIG. 8, which is described in more detail below, the power dissipation in the output stage is equal to or proportional ("~") to the following voltages and current shown in the figure.

$$\text{Power Dissipation} \sim ((V+)-(Vd))*(Id),$$

where Vd is the voltage across the DUT, Id is the current drawn by the DUT, and V+ is the voltage output of the voltage regulator. In FIG. 8, the instantaneous power to the DUT is equal to or proportional to the following voltages and current shown in the figure.

$$\text{Power To DUT} \sim (Vd)*(Id).$$

In some examples, the traditional and reverse compliance curves relate Vd and Id.

Figure 3:
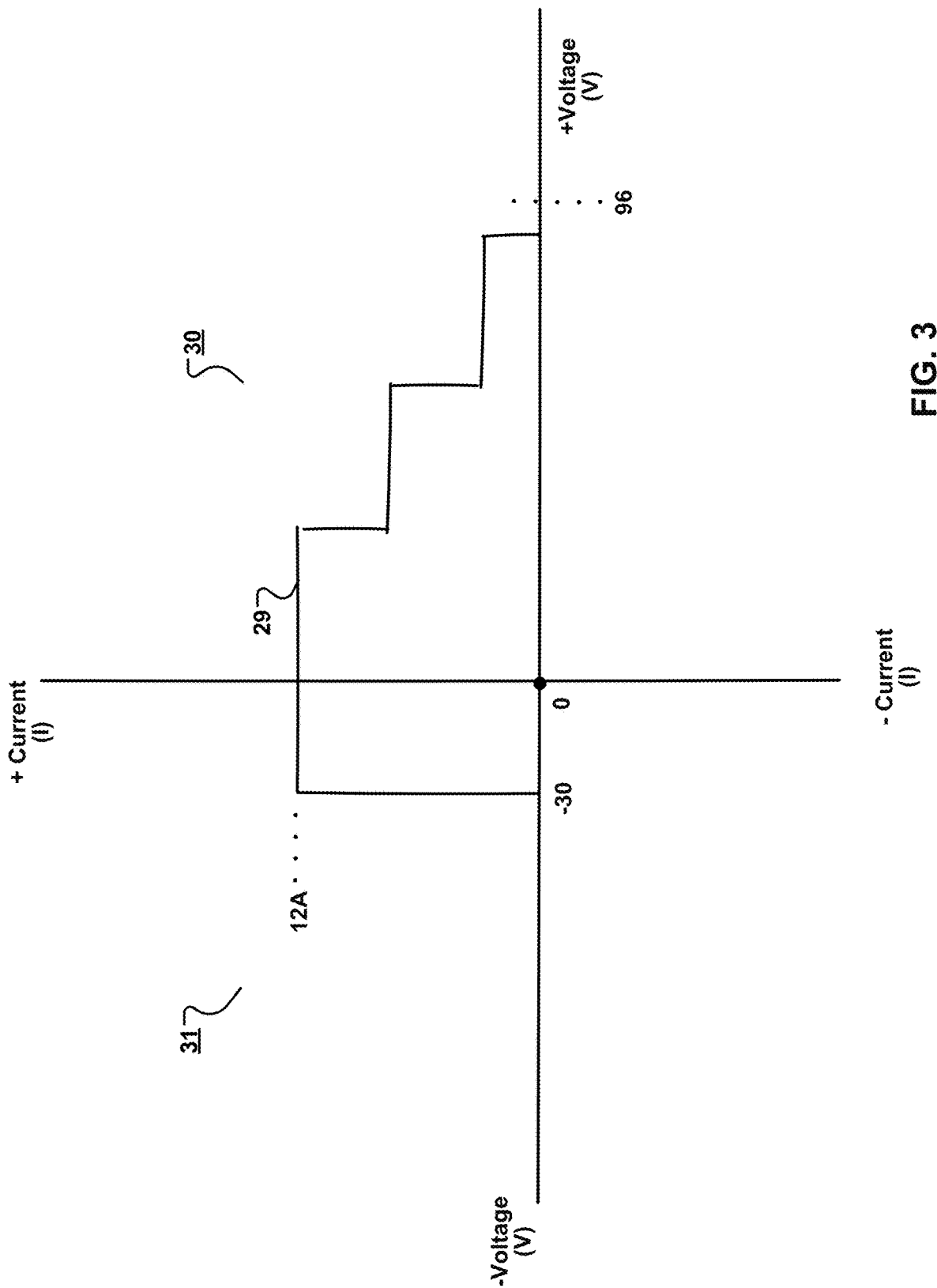
FIG. 3 is a graph showing a presented version of an example traditional compliance curve.

FIG. 3 shows another example of a traditional compliance curve 29 that defines the power dissipation of a test channel in two quadrants: positive voltage (+V), positive current (+I) and negative voltage (−V), positive current (+I). As shown in the figure, in this example, in first quadrant 30, as the magnitude of the voltage increases, the magnitude of the current decreases. In this example, in second quadrant 31, as the voltage increases, the current remains constant and does not increase.

Figure 4:
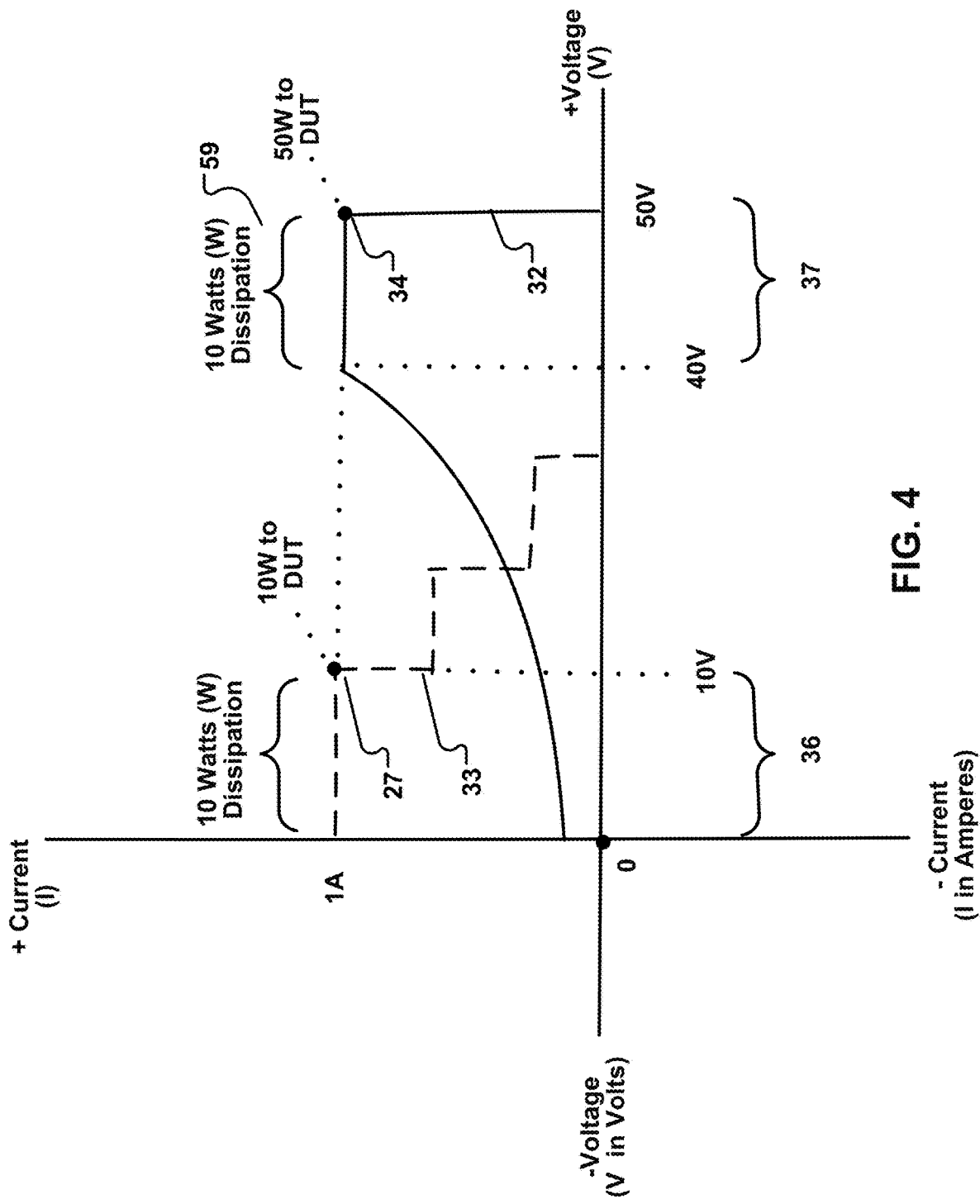
FIG. 4 is a graph showing a traditional compliance curve and a reverse compliance curve for the same output stage of the same test channel.

As noted, in a reverse compliance curve, as the absolute value of the voltage increases, the current increases. For a fixed-size test channel output stage, however, its power dissipation remains the same for all or parts of traditional and reverse compliance curves. For example, FIG. 4 shows an example of a reverse compliance curve 32 and a traditional compliance curve 33 for the same fixed-size output stage of a test channel. In the traditional compliance curve 33, a 10 Watt (W) power dissipation occurs for segment envelope 36; in this example (10V)*(1 A) equals 10 W. In the reverse compliance curve 32, which is also supported by the same test channel, that same 10 W power dissipation occurs at segment envelope 37; in this example (50V−40V)*(1 A) equals 10 W. So, the power dissipation is the same at different parts of the traditional and reverse compliance curves. However, at point 27 on the traditional compliance curve, the instantaneous power delivered to the DUT is 10 W; that is (10V)*(1 A) equals 10 W. By contrast, at point 34 on the reverse compliance curve, the instantaneous power delivered to the DUT is 50 W; that is (50V)*(1 A) equals 50 W. So, by using reverse compliance, it is possible to provide greater amounts of power using the same output stage of the test channel. In other words, it is possible to provide greater amounts of power without increasing the size of that output stage. A test channel may, however, support operation using both the traditional compliance curve and the reverse compliance curve.

Figure 5:
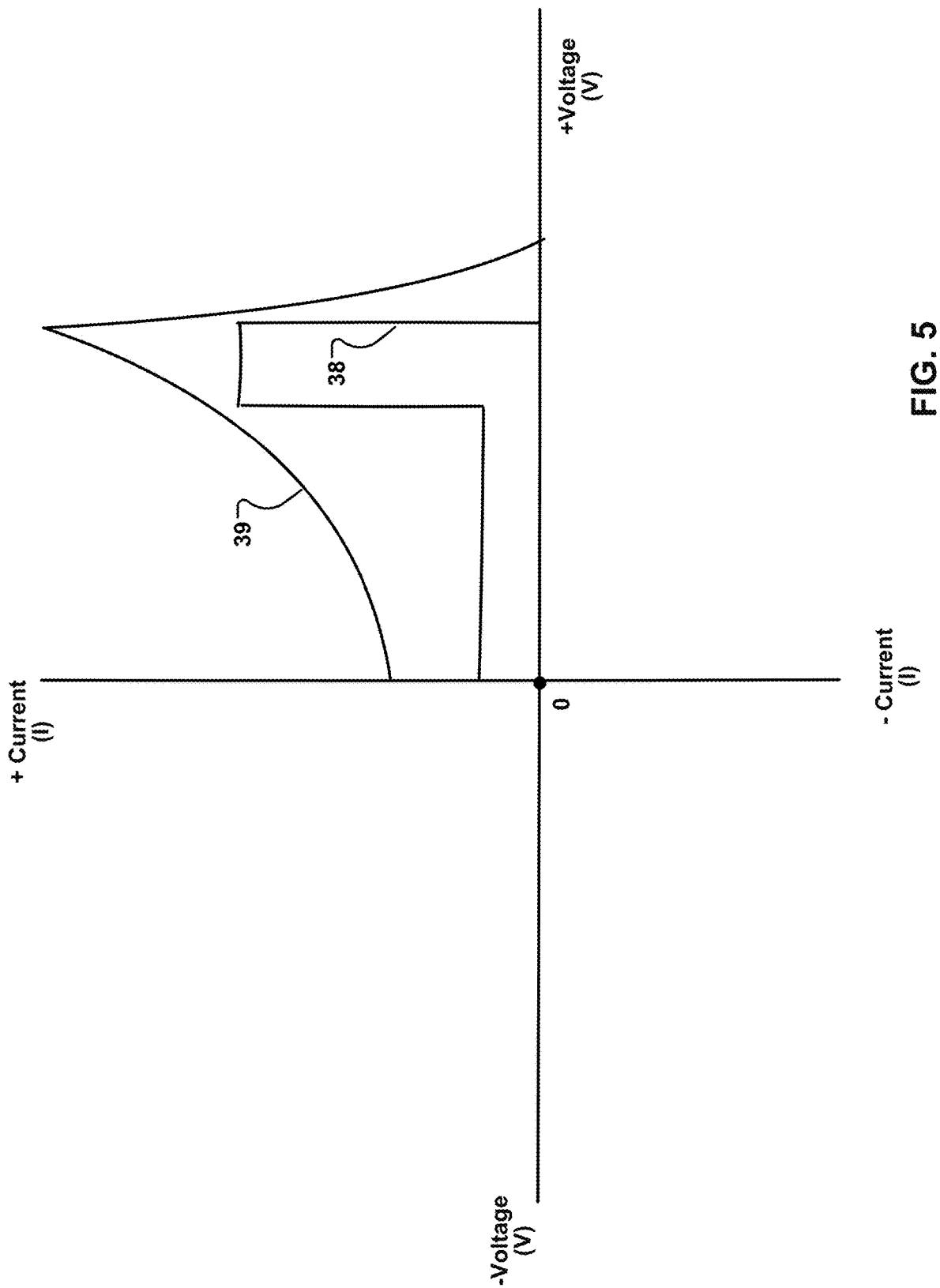
FIG. 5 is a graph showing an example reverse compliance curve in both a presented version and an actual version.

In some cases, the reverse compliance curve includes only the operational range of a test channel presented to a user, not the entire operational range of the test channel. The user may select a voltage and current from the presented reverse compliance curve to ensure safe and accurate operation of the test channel. However, the actual reverse compliance curve of the test channel extends beyond the presented reverse compliance curve presented to the user. For example, in FIG. 5, presented reverse compliance curve 38 is a step function that is within the bounds of the actual compliance curve 39. The actual reverse compliance curve 39 encompasses all of, and extends beyond, presented reverse compliance curve 38, as shown in the figure. The presented reverse compliance curve 38 does not track the boundaries of actual reverse compliance curve 39 and, therefore, reduces the risk of test channel operation at a power level beyond that supported by the test channel. In this specification, the term "reverse compliance curve" may refer to either an actual reverse compliance curve such as 39 or a presented reverse compliance curve such as 38.

Figure 6:
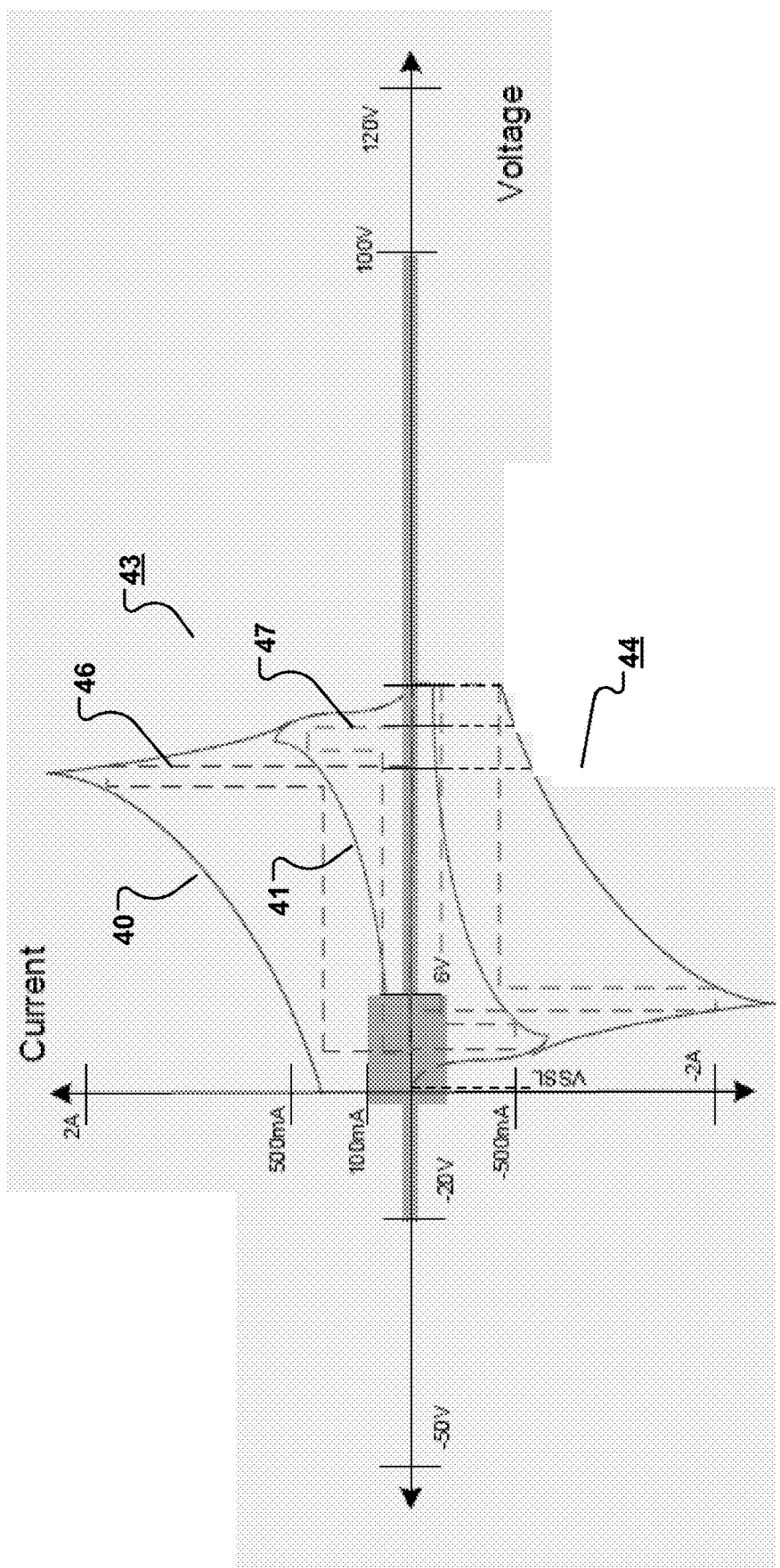
FIG. 6 is a graph showing example reverse compliance curves in both presented versions and actual versions.

FIG. 6 shows another example of two reverse compliance curves 40 and 41 that define the operational range of two test channels in two quadrants: positive voltage (+V), positive current (+I) 43 and positive voltage (+V), negative current (−I) 44. In this example, in fourth quadrant 44, as the absolute value of the voltage increases (+V), the current (−I) increases to a maximum value. After that value, the current rapidly goes to zero. In fourth quadrant 44, a less negative current constitutes an increase in current. For example, −500 milliamperes (mA) is an increase in current over −2 amperes (A). FIG. 6 also shows a presented compliance curve 46 in dashed lines for actual compliance curve 40, and a presented compliance curve 47 in dashed lines for actual compliance curve 41.

Figure 7:
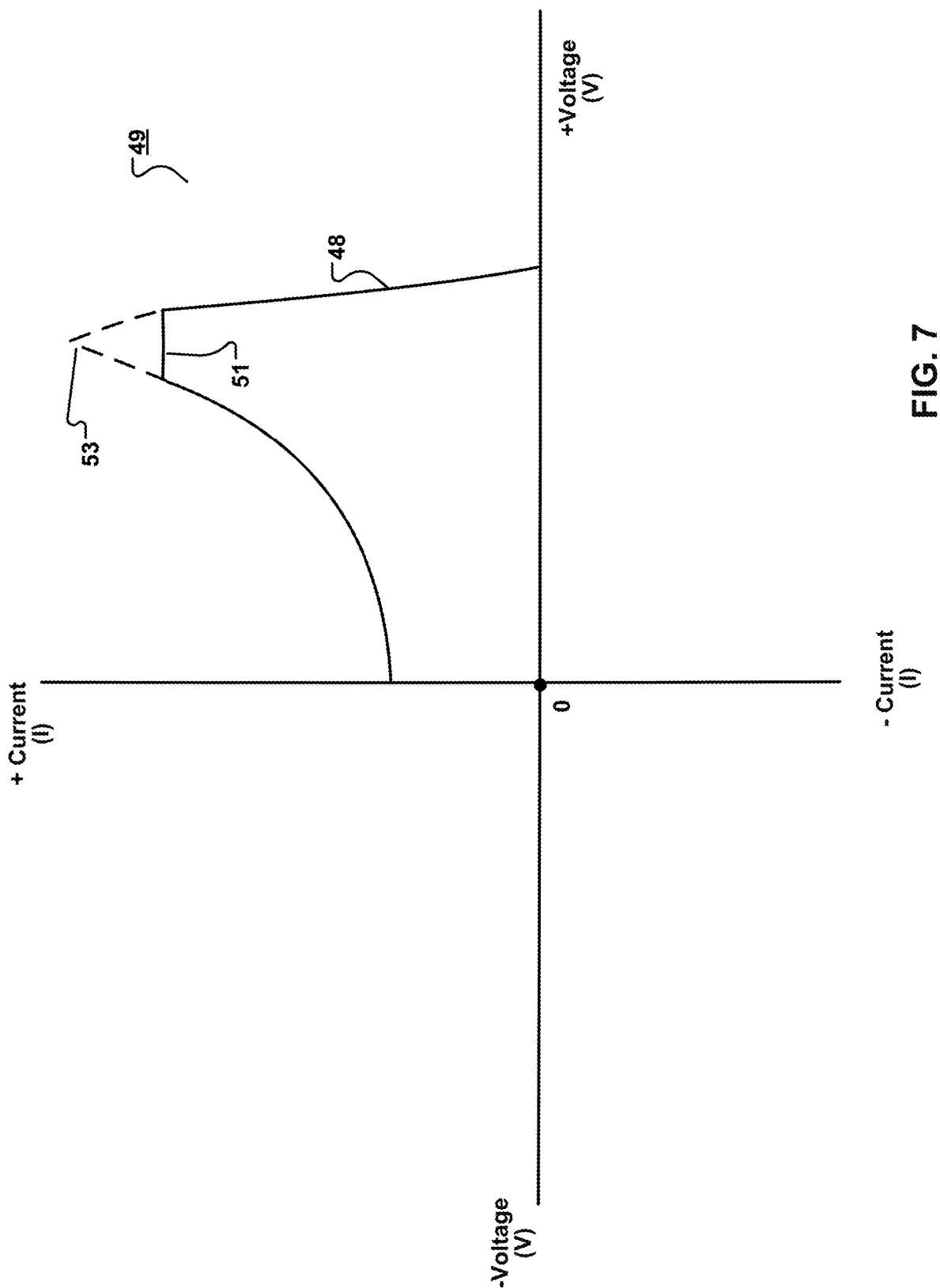
FIG. 7 is a graph showing an example reverse compliance curve containing a current plateau.

FIG. 7 shows another example of a reverse compliance curve 48 that defines the operational range of a test channel in a first quadrant 49. In this example, current increases non-linearly with increasing voltage up to a point 51. There, the current plateaus or remains constant for a range of increasing voltage and then rapidly drops to zero. The area between the plateau 51 and the peak 53 corresponds to the overhead voltage ($V_{OH}$). In an example, the overhead voltage to support the current level of the plateau is the difference between where the compliance curve drops to 0 amperes (A) (in volts, to the right of the plateau) and the right side of the plateau (in volts). As the current increases, the required overhead voltage also increases, which is what creates the peak in the curved compliance curve. In an example, the overhead voltage includes a voltage supported by a voltage rail of the test system but that is some fixed voltage above the voltage that the user can select for operation of the test channel. In some examples, the overhead voltage is 5 volts (V), 10V, 15V, 20V, and so forth. The overhead voltage may be programmed into the test system and, in some systems, may be changed. A user may be presented with a compliance curve like that of FIG. 7, but one that shows the plateau and not the peak.

Referring back to FIG. 1, that figure shows components of example automatic test equipment (ATE) 10 that may support both traditional compliance curves and reverse compliance curves of the type described herein. Notably, however, the traditional compliance curves and reverse compliance curves are not limited to use with the ATE of FIG. 1 or to use with the DUTs described herein, but rather may be used in any appropriate technical context. In FIG. 1, the dashed lines indicate potential signal paths between devices.

ATE 10 includes a test head 11 and a test computer 12. Test head 11 interfaces to the DUTs (not shown) on which tests are performed. Test computer 12 communicates with test head 11 to control testing. For example, test computer may download test program sets to test instruments on the test head, which then run the test program sets to test DUTs in communication with the test head. Computer 12 may also present traditional compliance curves and reverse compliance curves to a user—for example, graphically—to show the user the capabilities of test channels in ATE 10.

ATE 10 includes test instruments 13A to 13N. In this example, one or more of the test instruments are VI (voltage-current) test instruments configured to force direct current (DC) voltage and to force DC current onto a test channel and to receive signals from the device based on the forced DC voltage and forced DC current. However, other types of test instruments may be used in lieu of, or in addition to, VI test instruments. For example, test instruments may be used that are configured to produce alternating current (AC) voltage and/or AC current signals having frequencies that are greater than 1 kilohertz (KHZ). Each test instrument may be configured to output test signals to test a DUT, and to receive signals from the DUT. The signals received may include response signals that are based on the test signals and/or signals that originate from the DUT that are not prompted by (e.g., are not in response to) test signals.

Signals are sent to, and received from, the DUT over multiple test channels. In some examples, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over one or more physical transmission media.

In some implementations, different test channels of ATE 10 may all support the same compliance curves or different test channels of ATE 10 may support different compliance curves. For example, output stages of different test channels may dissipate different amounts of power or output stages of different test channels may dissipate the same amount of power. In some implementations, some test channels may support only traditional compliance curves, some test channels may support only reverse compliance curves, some test channels may support both traditional compliance curves and reverse compliance curves, or all test channels may support both traditional compliance curves and reverse compliance curves ATE 10 includes a connection interface 14 that connects test instrument test channels 15 to a DIB 16. Connection interface 14 may include connectors 20 or other devices for routing signals between the test instruments and DIB 16. For example, the connection interface may include one or more circuit boards or other substrates on which such connectors are mounted. Conductors that define the instrument test channels may be routed through the connection interface and the DIB.

In the example of FIG. 1, DIB 16 connects, electrically and mechanically, to test head 11. The DIB includes sites 21, which may include pins, conductive traces, or other points of electrical and mechanical connection to which DUTs may connect. Test signals, response signals, and other signals pass via the test channels over the sites between the DUT and test instruments. DIB 16 also includes, among other things, connectors, conductive traces, and circuitry for routing signals between the test instruments, DUTs connected to sites 21, and other circuitry.

FIG. 8 shows example of components that may be included in the output stage of an example test channel 60, such as test channel of test instrument 13A. As shown in FIG. 8, the output stage of test channel 60 includes power amplifier circuitry 61. The power amplifier circuitry may include a power amplifier configured to force voltage and current to the transmission media portion 64 of the test channel. The test channel also includes one or more processing devices 65 configured to control the power amplifier circuitry to comply with one or more compliance curves. For example, the processing devices may implement a controller, such as a proportional-integral-derivative (PID) controller to control the power amplifier circuitry. In some implementations the controller may include feed-forward components making it not solely a PID controller. In an example, the compliance curve may be a traditional compliance curve such as those shown in FIGS. 2, 3, and 4 or a reverse compliance curve such as those shown in FIGS. 4 to 7. Computer memory, which may be internal or external to processing devices 65, may store the compliance curves.

The compliance curves may be retrieved from memory by test computer 12 (of FIG. 1) for display a user on a display screen that is part of the test computer. In some implementations, the memory may store information or functions that define the compliance curves and from which the compliance curves may be determined. In some implementations, the user may then select a voltage and/or a current to output on the test channel—for example, to the DUT—that are within the operational range of the test instrument on the compliance curves. In some implementations, the user may select or program a voltage supported by the compliance curves and the system may automatically determine a current based on that voltage. And, in some implementations, the user may select the current and the system may automatically determine the voltage The processing devices may then control the power amplifier, a voltage regulator 67, or both, to force the voltage and current to the test channel. Examples of types of processing devices that may be used are described herein.

As previously explained, in FIG. 8, the power dissipation in the output stage is equal to or proportional to the following voltages and current shown in the figure.

$$\text{Power Dissipation} \sim ((V+)-(Vd))*(Id),$$

where $Vd$ is the voltage across the DUT, $Id$ is the current drawn by the DUT, and $V+$ is the voltage output of the voltage regulator. In some implementations, $V+$ can be changed through programming, which will result in an change in power dissipation of the output stage. As also previously explained, in FIG. 8, the instantaneous power to the DUT is equal to or proportional to the following voltages and current shown in the figure.

$$\text{Power To DUT} \sim (Vd)*(Id).$$

In some examples, controlling the power amplifier circuitry to force the voltage and current to the test channel and thus to the DUT in accordance with a reverse compliance curve and/or a traditional compliance curve includes the processing devices determining the current. For example, the processing devices may determine the maximum current based on an amount of power that the channel can support—that is, the test channel dissipation, a maximum voltage, and a voltage that has been programmed into the test system by the user. For example, the processing devices may determine the maximum voltage based on an amount of power that the channel can support—that is, the test channel dissipation, a maximum voltage, and a current that has been programmed into the test system by the user.

In some examples, the user programs either voltage ($V_{prog}$) or current ($I_?$), not both. These are commonly referred to as "force voltage" and "force current" modes respectively. The electrical loading of the DUT determine the variable that is not explicitly forced. One can see this clearly if one considers the case where the DUT is a simple resistor—the system can force a voltage across the resistor (having a resistance R) and the system can obtain a current defined by V/R (where V is the voltage across the resistor), or the system can force a current and one can obtain a voltage defined by I*R (where I is the current through the resistor). In some examples, both voltage and current cannot be forced simultaneously. So the system forces either voltage or current and the non-forced variable is determined by the load that is presented to the channel. Another consideration here is that the non-forced variable can have a user-programmable "clamp" that prevents that variable from going beyond that programmed value. For example, a value of the variable to be clamped may be set by programming. For example, a current clamp value may be set dynamically based on the following relationship. In an example, the current clamp value may be set dynamically based on the voltage across the DUT, namely Vd, in order to limit the current on the test channel.

$$\text{Power Dissipation} \sim ((V+)-(Vd))*(Id)$$

By controlling the current clamp dynamically based on the voltage across the DUT, namely Vd, the initial curvature of the reverse compliance curve results. For instance, in the example of FIG. 4, the curvature prior to 40V results. In systems that employ traditional compliance curves only, if a current clamp is used, the maximum current on the test channel is not related to, or dependent on, Vd, but rather is preset.

When the load is such that the non-forced variable would exceed the clamped value, the VI channel dynamically changes state (via the processing device(s)) to instead force the "non-forced" variable so that its clamp is not exceeded. Thus, in summary, an example channel can force voltage or current, but not both simultaneously. In this example, the channel can be set-up to dynamic switch between which it is forcing depending on the load, but it is still always and only forcing one at a time, the other is determined by the load.

In the equation below relating power, voltage, and current on the test channel, "P" is the maximum power dissipation of test channel (which is a known quantity) and $V_{HS}$, or V-high-side, is the maximum voltage that the test system can provide in a selected compliance curve through its voltage rail.

In the equation below, in a case where voltage is forced, all variables are known except for $I_?$ and P is the product of ($V_{HS}-V_{prog}$) and ($I_?$). In the following equation, in a case where current is forced, all variables are known except for $V_{prog}$, and P is the product of ($V_{HS}-V_{prog}$) and ($I_?$)

$$P=(V_{HS}-V_{prog}) \times (I_?)$$

Accurate setting of the current may be conditioned on the voltage that has been programmed into the test system ($V_{prog}$) being less than or equal to a difference between the maximum voltage ($V_{HS}$) and the overhead voltage ($V_{OH}$). That is, $$V_{prog} \leq V_{HS}-V_{OH}$$

If $V_{prog}$ is greater than $V_{HS}-V_{OH}$, then the test channel is operating at near the maximum voltage provide by the voltage rail and may be susceptible to over-voltage conditions or other problems associated with operating at excess voltage.

The processing devices may be part of a compensation loop that includes the voltage regulator, the power amplifier circuitry, voltage sensors, and current sensors. For example, the voltage regulator may be a programmable regulator to output a range of voltages to power amplifier 61. The power amplifier is configured for control by processing devices 65 to output, to the transmission media portion 64 of the test channel, current and voltage derived from the voltage provided by the voltage regulator. A voltage sensor 70 senses the voltage on the transmission media portion 64 of the test channel and provides the level of the sensed voltage to processing devices 65. A current sensor 71 senses the current through—in this example, a resistor 72—on the transmission media portion 64 of the test channel and provides the level of the sensed current to processing devices 65. Analog-to-digital converters (not shown) or digitizers generate digital values for the sensed voltage and the sensed current. The processing devices determine the amount of power being sourced on the test channel based on the digital values of the sensed voltage and the sensed current, for example, by determining a product of the sensed voltage and the sensed current. In some implementations, an analog compensator may be used instead of a digital compensator. An analog compensator performs the processing in the analog domain instead of the digital domain.

If the amount of power dissipation on the transmission media portion 64 of the test channel and thus through the DUT exceeds a power level of the compliance curves for the test channel—for example, a traditional compliance curve, a reverse compliance curve, or both the traditional compliance curve and the reverse compliance curve—then the processing devices control a current clamp 74 to limit the amount of current, and thus power, on the test channel. The current clamp may be a fast dynamic clamp that cuts-off or reduces current if too much power is being sourced. For example, the clamp may operate on the order of tens of microseconds (µs). The clamp limits the current draw when a DIB/DUT load transient results in a large voltage change that puts the voltage and current being sourced into an over-power state as defined by the compliance curves. This current clamp may be configured to reduce output stage power dissipation to a sustainable limit within, for example, 50 µs, and in a several millisecond (ms) time frame disengage to allow the user-defined voltage from the compliance curve to take-over. The clamp may be implemented as part of the processing devices, in the power amplifier, or the clamp may be or include hardware that is controllable by the processing devices. In this example, the clamp is dynamically controllable—for example, by the one or more processing devices—based on a voltage across the DUT (Vd) as described previously.

In some implementations, the output stage including the power amplifier circuitry is connected to a reference voltage 76 (V+) and a return conductor 75 (V−). The reference voltage is higher than a voltage of the return conductor and may be the voltage used to produce the current and voltage output on the transmission media portion 64 of the test channel. For example, the reference voltage may be 5V, 10V, 50V, 100V, 300V, and so on. The voltage of the return conductor is set to a non-zero voltage in some examples. For example, the voltage of the return conductor is not at ground level. For example, the voltage of the return conductor may be set at 1V, 2V, 3V, 5V, 10V, and so forth. The rationale for the return conductor of the output stage to be above 0V ("ground") is to reduce the voltage-current (V*I) product across the output stage.

As explained, in some implementations, controlling the power amplifier circuitry to comply with a compliance curve may include setting the current output based the voltage that has been programmed into the test system. Using a reverse compliance curve may enable a channel density that is greater than a channel density that would be enabled by a traditional compliance curve (according to which the current output decreases as the voltage output increases). In this regard, the output stage, including the power amplifier circuitry, has a physical size that corresponds to its power dissipation. By using a reverse compliance curve, the physical size of the output stage may be reduced relative to the physical size of the output stage that would be needed if a traditional compliance curve were used. More specifically, as explained with respect to FIG. 4, using reverse compliance, the output stage of the test channel can provide 50V to a DUT. Using a traditional compliance curve for a fixed-size output stage, only 10 W is provided to the DUT. Therefore, to produce a power output to the DUT using a traditional compliance curve that is similar the power output to the DUT produced using a reverse compliance curve, the output stage would need to be increased in size. Accordingly, using reverse compliance, a smaller output stage can be used to output greater instantaneous power to the DUT.

For example, using the traditional compliance 30 of FIG. 3 in order to achieve a current output 12 A in a single test channel, the power dissipation of the output stage is determined as follows:

$$P=(96V-(-30V))\times12\ A\approx1.5\ kilowatts\ (kW)$$

For example, using a reverse compliance curve, the power dissipation of the output stage is determined as follows:

$$(5V+2V)\times2\ A=14\ watts\ (W)$$

To achieve a 12 A total output, six channels are used, which produces a power output of 14 W×6=84 W. As noted, the physical size of the output stage scales with the power—for example, as power increases, the size of the circuitry required to produce that power output also increases. By requiring less power (84 W vs. 1512 W) to output the same amount of current (12 A), the circuitry in the test channel that is controlled based on a reverse compliance curve can be reduced in size. And, as a result of the smaller size of the circuitry, a greater number of test channels can be arranged in a same space, thereby increasing the density of the test channels.

In some implementations, when using a VI test instrument as a device power supply (DPS), allowing an upper power supply of the output stage to ramp with the voltage and current output force voltage (FV) ramp enables the full rated current during the DPS voltage ramp. In some implementations, the output stage voltage rail or rails may track the real-time DUT voltage. An implementation of a test channel that includes the features actively measures a resistance in the force and return paths and automatically adjusts the output stage voltage based on this information. For example, the output stage voltage may be adjusted to control the power output in order to keep the power output within the scope of a selected compliance curve.

Figure 9:
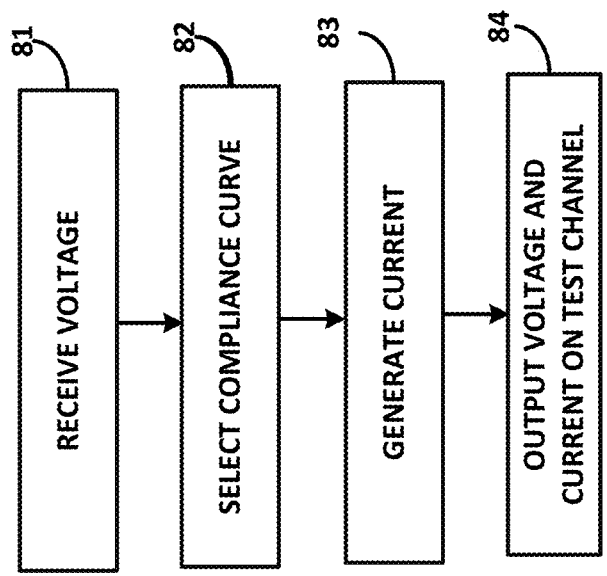
FIG. 9 is a flowchart showing an example process for generating voltage and current using one or more compliance curves.

Referring to FIG. 9, a process 80 for controlling a test channel includes, but is not limited to, the following operations. The process includes receiving (81) voltage as an input to a test system. For example, the voltage may be programmed into the test computer by a user, such as a test engineer. The voltage is the target forced voltage for output on a test channel of interest. The process includes selecting (82) a compliance curve based on the voltage. This selection may be performed by the user or by a processing device controlling the test system such as ATE 10. The process includes generating (83) a current output based on the voltage input and the compliance curve, as described previously. The voltage and the current are output (84) to the test channel as part of the testing process. As described previously, in some implementations, the current may be programmed into the test computer by a user, such as a test engineer, and the voltage may be the unknown that is determined.

The example systems and processes described herein may be used with any appropriate test system. For example, the systems and processes may be used with a high-voltage, low-current VI instrument, where an example high-voltage is 100V or more and where an example low-current is 200 milliamperes (mA) or less. For example, the systems and processes may be used with a high-voltage, low-current non-floating instrument or a high-voltage, high-current floating test instrument.

All or part of the test systems and processes described in this specification and their various modifications may be configured or controlled at least in part by one or more computers using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test systems and processes can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A test system comprising:
an output stage comprising power amplifier circuitry to force voltage or current to a test channel; and
one or more processing devices to select a compliance curve from among a first compliance curve and a second compliance curve that are both for the output stage, where the compliance curve relates output of the voltage to output of the current for the output stage, where according to the first compliance curve voltage increases as current increases, and where according to the second compliance curve voltage increases as current decreases, the one or more processing devices to control the power amplifier circuitry to comply with a selected compliance curve, where the selected compliance curve is the first compliance curve or the second compliance curve.

2. The test system of claim 1, wherein the voltage is direct current (DC) voltage and the current is DC current.

3. The test system of claim 1, further comprising a compensation loop, the compensation loop comprising:
a voltage sensor to sense the voltage on the test channel;
a current sensor to sense the current on the test channel; and
the one or more processing devices to control the power amplifier circuitry based on the voltage sensed on the test channel and the current sensed on the test channel.

4. The test system of claim 3, further comprising:
a current clamp to limit the current on the test channel in a case that the current sensed on the test channel exceeds a predefined maximum value.

5. The test system of claim 1, wherein the compliance curve is based on an amount of power that the output stage can dissipate.

6. The test system of claim 1, wherein memory stores the first compliance curve and the second compliance curve or information to produce the second compliance curve; and
wherein the one or more processing devices are configured to select the compliance curve based on user or programmatic input.

7. The test system of claim 1, wherein at least one of the first compliance curve or the second compliance curve comprises a step function.

8. The test system of claim 6, wherein the first compliance curve comprises a step function and the second compliance curve comprises a step function.

9. The test system of claim 1, wherein the one or more processing devices are configured to implement a controller comprising a proportional-integral-derivative controller to control the power amplifier circuitry.

10. The test system of claim 1, further comprising:
a display device to display a function based on the compliance curve to a user; and
an input device to program the voltage based on the function.

11. The test system of claim 10, wherein the function is the compliance curve.

12. The test system of claim 10, wherein the function is a step function that falls within bounds of the compliance curve.

13. The test system of claim 1, wherein controlling the power amplifier circuitry to comply with the selected compliance curve comprises setting the current; and
wherein setting the current is based on an amount of power that the output stage can dissipate, a maximum voltage, and the voltage that has been programmed into the test system.

14. The test system of claim 13, wherein setting the current is conditioned on the voltage that has been programmed into the test system being less than or equal to a difference between the maximum voltage and an overhead voltage.

15. The test system of claim 1, wherein the output stage is connected to a reference voltage and a return conductor, the reference voltage being higher than a voltage of the return conductor, and the voltage of the return conductor being non-zero.

16. The test system of claim 1, wherein controlling the power amplifier circuitry to comply with the first compliance curve comprises setting the current based the voltage that has been programmed into the test system; and
wherein the first compliance curve enables a test channel density that is greater than a test channel density that would be enabled by the second compliance curve.

17. The test system of claim 16, wherein the output stage has a physical size that corresponds to a power dissipation of the output stage.

18. The test system of claim 1, wherein the output stage is connected to a first reference voltage and a second reference voltage, the first reference voltage being higher than the second reference voltage;
wherein the test system further comprises a voltage sensor for sensing the voltage on the test channel; and
wherein the one or more processing devices are configured to control at least one of the first reference voltage or the second reference voltage based on the voltage on the test channel in order to control power output to the test channel.

19. The test system of claim 1, wherein the output stage is connected to a first reference voltage and a second reference voltage, the first reference voltage being higher than the second reference voltage; and
wherein at least one of the first reference voltage or the second reference voltage is programmable.

20. The system of claim 1, further comprising:
memory storing the first compliance curve or a function to produce the second compliance curve.

21. The system of claim 1, wherein the first compliance curve comprises a curve in which current increases with increasing voltage up to a point; and
wherein, after the point, the current remains constant for a range of increasing voltage.

22. The test system of claim 1, wherein the voltage is alternating current (AC) voltage and the current is AC current.

23. A method comprising:
receiving a value for a voltage as an input to a test system;
selecting a compliance curve from among a first compliance curve and a second compliance curve that are both for a same output stage that forces voltage or current to a test channel of a test system, where the compliance curve that is selected relates output of the voltage to output of the current for the output stage, where according to the first compliance curve voltage increases as current increase, and where according to the second compliance curve voltage increases as current decreases, the compliance curve that is selected being the first compliance curve or the second compliance curve and being based on the value for the voltage that is input;
generating a current output based on the voltage input and the compliance curve that is selected; and
forcing the voltage and the current to the test channel.

24. A test system comprising:
an output stage comprising power amplifier circuitry to force voltage or current to a test channel that is part of a connection to a device under test (DUT);
a current clamp to limit the current on the test channel; and
one or more processing devices configured to select a compliance curve from among a first compliance curve and a second compliance curve that are both for the output stage, where the compliance curve relates output of the voltage to output of the current for the output stage, where according to the first compliance curve voltage increases as current increase, and where according to the second compliance curve voltage increases as current decreases, the one or more processing devices to control the power amplifier circuitry to comply with a selected compliance curve, the selected compliance curve being the first compliance curve or the second compliance curve, and the one or more processing devices being configured to control the current clamp dynamically based on a voltage across the DUT in order to control a curvature of the selected compliance curve.

25. The test system of claim 24, wherein a power dissipation through the output stage is based on a product of a current through the DUT and a difference between a voltage across the output stage and a voltage across the DUT.

26. The test system of claim 24, wherein controlling the current clamp dynamically comprises controlling the limit of the current on the test channel.

27. The test system of claim 24, wherein controlling the current clamp comprises programming the current clamp.

28. The test system of claim 24, wherein the one or more processing devices are configured to control the power amplifier circuitry to comply with the selected compliance curve.

29. A test system comprising:
an output stage configured to force at least one of voltage or current to a test channel to produce a channel voltage on the test channel, the output stage being configured to receive a supply voltage, where a power dissipation of the output stage is based on a difference between the channel voltage and the supply voltage, and where a maximum power dissipation that the output stage can support is based on the physical size of the output stage; and
a voltage regulator to provide the supply voltage to the output stage, the voltage regulator being programmable to change the supply voltage in order to control the power dissipation based on the physical size of the output stage and based on whether the output stage is being controlled according to a first compliance curve or a second compliance curve that are both for the output stage, where each compliance curve relates output of the voltage to output of the current for the output stage, where according to the first compliance curve voltage increases as current increase, and where according to the second compliance curve voltage increases as current decreases.

30. The test system of claim 29, wherein the voltage regulator is programmable to change the power dissipation to a value that is less than the maximum power dissipation.

31. The test system of claim 29, wherein the output stage comprises power amplifier circuitry.

32. The test system of claim 29, wherein a reduction in a difference between the supply voltage and the channel voltage for a current from the output stage enables a reduction in the physical size of the output stage.

33. The test system of claim 29, wherein the physical size of the output stage is proportional to a difference between the supply voltage and the channel voltage at a maximum current through the output stage.

34. The test system of claim 29, further comprising:
a controller to control the voltage regulator based on voltage and current sensed on the test channel.

35. The test system of claim 34, wherein the controller comprises one or more processing devices that are dedicated to the test channel.

36. The test system of claim 29, further comprising:
a controller to control the output stage based on voltage and current sensed on the test channel.

37. The test system of claim 36, wherein the controller comprises one or more processing devices that are dedicated to the test channel.

* * * * *